US006867904B2

(12) United States Patent
Ng et al.

(10) Patent No.: US 6,867,904 B2
(45) Date of Patent: Mar. 15, 2005

(54) INTEGRATED OPTICAL CIRCUIT FOR EFFECTING STABLE INJECTION LOCKING OF LASER DIODE PAIRS USED FOR MICROWAVE SIGNAL SYNTHESIS

(75) Inventors: Willie W. Ng, Agoura Hills, CA (US); Daniel Yap, Newbury Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 10/417,020

(22) Filed: Apr. 16, 2003

(65) Prior Publication Data

US 2003/0197918 A1 Oct. 23, 2003

Related U.S. Application Data

(60) Provisional application No. 60/373,742, filed on Apr. 17, 2002.

(51) Int. Cl.[7] .......................... G02F 1/365; G02F 2/02; H04B 10/142
(52) U.S. Cl. ...................... 359/332; 398/204; 398/207
(58) Field of Search ............................. 359/325–332; 398/204–207

(56) References Cited

U.S. PATENT DOCUMENTS

| | | | |
|---|---|---|---|
| 5,379,309 A | 1/1995 | Logan, Jr. ................ 372/18 |
| 5,617,239 A | 4/1997 | Walker .................... 359/181 |
| 5,687,261 A | 11/1997 | Logan ..................... 385/24 |
| 5,710,651 A | 1/1998 | Logan, Jr. ................ 359/145 |
| 5,796,506 A | 8/1998 | Tsai ....................... 359/191 |
| 5,859,611 A | 1/1999 | Lam et al. ................ 342/368 |
| 6,262,681 B1 | 7/2001 | Persechini ................ 342/188 |
| 2003/0197917 A1 | 10/2003 | Yap et al. ................. 359/330 |
| 2003/0227629 A1 * | 12/2003 | Dobbs et al. .............. 356/437 |
| 2004/0051936 A1 * | 3/2004 | Watson et al. ............. 359/326 |

FOREIGN PATENT DOCUMENTS

EP    0 352 747    1/1990

OTHER PUBLICATIONS

Bordonalli, A.C., et al., "High–Performance Phase Locking of Wide Linewidth Semiconductor Lasers by Combined Use of Optical Injection Locking and Optical Phase–Lock Loop," *Journal of Lightwave Technology*, vol. 17, No. 2, pp 328–342 (Feb. 1999).

(List continued on next page.)

Primary Examiner—John D. Lee
(74) Attorney, Agent, or Firm—Ladas & Parry LLP

(57) ABSTRACT

An apparatus containing an integrated optical circuit that enhances phase stability of the injection-locking process of two slave lasers. The integrated optical circuit helps to reduce phase noise by keeping environmental or mechanical perturbations uniform everywhere on that circuit. Also, the integrated optical circuit provides connections for additional components to be coupled, which can monitor and control the performance characteristics of the integrated optical circuit and the injection-locking process.

55 Claims, 10 Drawing Sheets

OTHER PUBLICATIONS

Johansson, L.A., et al., "Millimeter–Wave Modulated Optical Signal Generation with High Spectral Purity and Wide–Locking Bandwidth Using a Fiber–Integrated Optical Injection Phase–Lock Loop," *IEEE Photonics Technology Letters*, vol. 12, No. 6, pp 690–692 (Jun. 2000).

Kazovsky, L.G., et al., "A 1320–nm Experimental Optical Phase–Locked Loop: Performance Investigation and PSK Homodyne Experiments at 140 Mb/s and 2 Gb/s," *Journal of Lightwave Technology*, vol. 8, No. 9, pp 1414–1425 (Sep. 1990).

Kikuchi, K., et al., "Amplitude–Modulation Sideband Injection Locking Characteristics of Semiconductor Lasers and their Application," *Journal of Lightwave Technology*, vol. 6, No. 12, pp 1821–1830 (Dec. 1988).

Ramos, R.T., et al., "Optical Injection Locking and Phase–Lock Loop Combined Systems," *Optics Letters*, vol. 19, No. 1, pp 4–6 (Jan. 1, 1994).

Yap, D., et al., "Agile Waveform Generation & Frequency Conversion," *RF–Lightwave Integrated Circuits Program Kickoff Meeting*, pp DY1–DY10 (Aug. 16, 2000).

Yap, D., et al., "Switched Photonic Link for Distribution of Local–Oscillator Signals," *IEEE Photonics Technology Letters*, vol. 12, No. 11, pp 1552–1554 (Nov. 2000).

*Radio Frequency Photonic Synthesizer*, United Telecommunications Products, Inc., Chalfont, PA, Transmission Systems Division, (Jan. 2000).

Ghirardi, F., et al., "Monolithic Integration of an InP Based Polarization Diversity Heterodyne Photoreceiver with Electrooptic Adjustability," *Journal of Lightwave Technology*, vol. 13, No. 7, pp 1536–1549 (Jul. 1995).

* cited by examiner

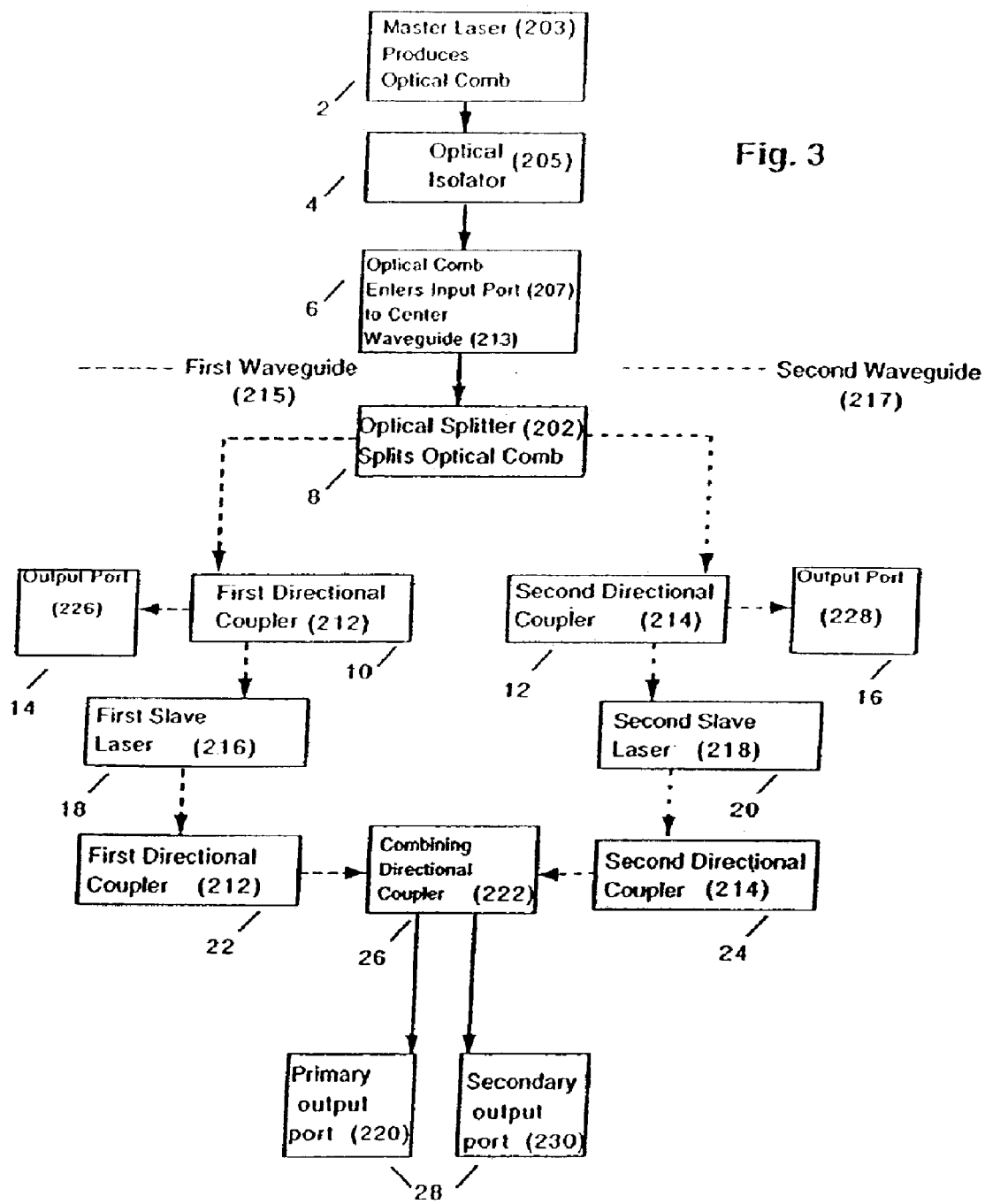

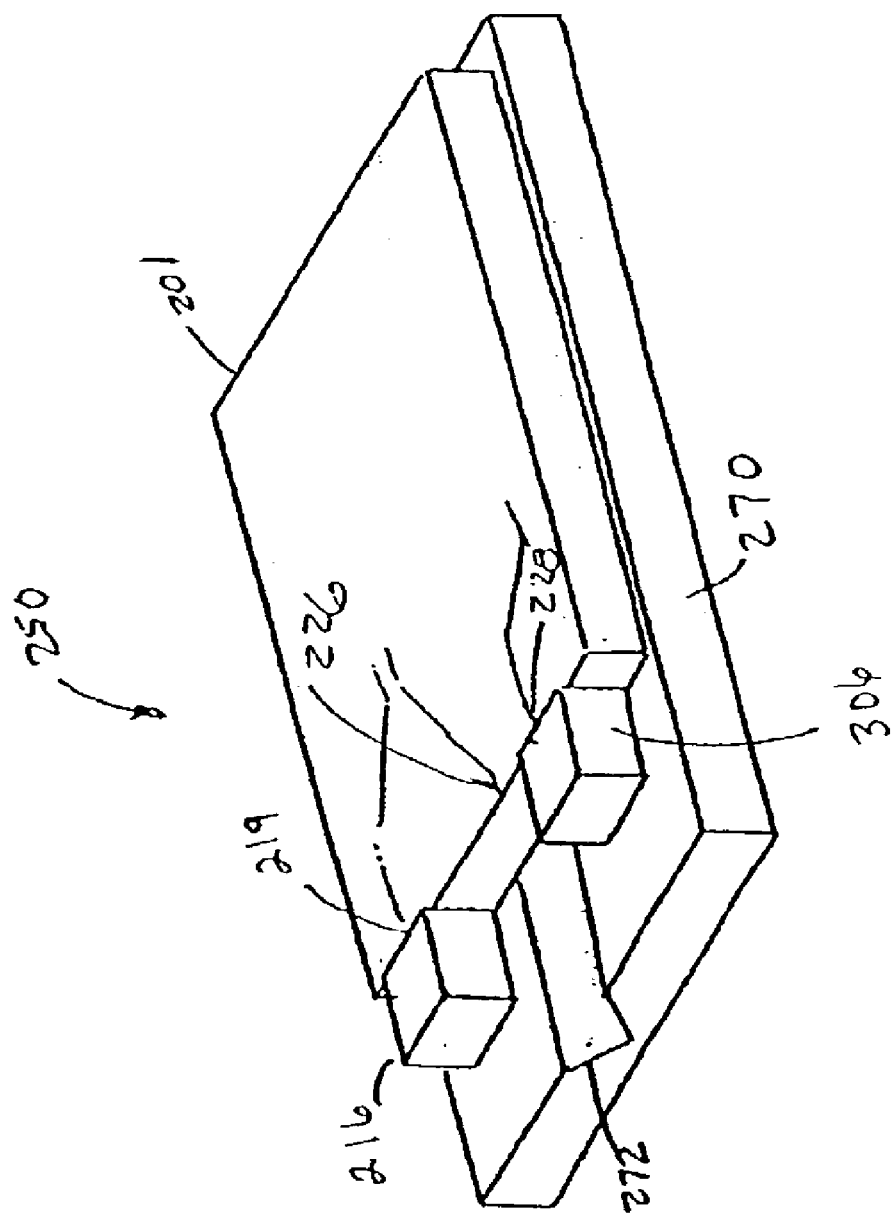

INTEGRATED OPTICAL CIRCUIT FOR EFFECTING STABLE INJECTION LOCKING OF LASER DIODE PAIRS USED FOR MICROWAVE SIGNAL SYNTHESIS

CROSS REFERENCE TO RELATED APPLICATION.

The present document claims the benefit of U.S. Provisional Application Ser. No. 60/373,742, filed Apr. 17, 2002, the contents of which are incorporated by reference herein.

The present document is related to the copending and commonly assigned patent application document entitled "Low-Noise, Switchable RF-Lightwave Synthesizer," Ser. No. 60/373,739. The contents of this related application is hereby incorporated by reference herein.

STATEMENT OF GOVERNMENT INTEREST

This invention was made with government support under Contract No. N6601-99-C-8635. The government has certain rights in this invention.

FIELD

The present invention relates to the generation of microwave signals. More specifically, this invention relates to an integrated optical circuit that enables the stable injection locking of two distributed feedback (DFB) diode lasers, whose outputs can be converted into microwave signals.

BACKGROUND

Frequency synthesis is used to generate 'signals at one or more precise frequencies. These signals may then be used to perform frequency conversion in radio frequency (RF) sensor and communication systems. Frequency synthesis may be provided by several different methods. Of concern in frequency synthesis, are the phase, frequency and amplitude stability of the generated signal. Since the generated signal may be used as a local oscillator signal for frequency up-conversion or down-conversion, instability in the signal results in decreased signal-to-noise performance.

One method of frequency synthesis involves the generation of a multiple tone lightwave signal that can be converted into a RF carrier or local oscillator signal. In this method, optical heterodyning is used to create a sum or difference beat frequency from two optical wavelength tones. The sum or difference beat frequency is detected by a photodetector or similar apparatus to generate an RF carrier or local oscillator signal. However, the stability of the beat frequency signal is limited by the relative stability of each of the optical wavelength tones.

In, R. Logan, R. D. Li, Final Technical Report for DARPA Program, "Radio Frequency Photonic Synthesizer" an optical heterodyning circuit, shown in FIG. 1, is disclosed. This circuit contains a mode locked laser 100, two DFB lasers 102, 104, an optical splitter 122, two optical circulators 114, 116, an optical combiner 124, two photodetectors 110, 112 connected to power-control feedback circuits 106, 108, and two Mach-Zender modulators 118, 120. The components of this optical circuit are interconnected using optical fiber. As the figure shows, the optical comb generated by a master laser (which in this case is a mode-locked laser) is split by a power splitter 122 and then is sent, via optical fibers, to injection-lock a pair of slave lasers, DFB-laser-1 102 and DFB-laser-2 104. Each of these slave lasers would become injection-locked to a line of the optical comb if the spacing or detuning between the free-running laser's lasing wavelength and that line of the optical comb is less than the laser's lock-bandwidth, a wavelength range determined by the injected power $P_i$. In particular, temperature tuning (~0.1 nm/° C.) was used to change the slave lasers lasing wavelengths, so that they were tuned to within the injection-locking bandwidth of two selected lines in the incident optical comb. In between the master and slave lasers, a pair of Mach-Zender modulators 118, 120 is used as variable attenuators to provide a way to adjust the injected optical power $P_i$. The optical outputs from the Mach-Zender modulators 118, 120 are fed to port 1 of two optical circulators 114, 116. The optical signals from the two slave lasers 102, 104 are used for heterodyning and are obtained through port 2 of those optical circulators 114, 116. The slave laser outputs from port 2 of the two circulators 114, 116 are subsequently combined by combiner 124 and then sent to a photodetector ($PD_3$) for heterodyning.

As shown in FIG. 1, the photonic components (optical isolators, Mach-Zender modulators for controlling injected optical power, optical circulators, and optical combiner) used to generate the optical outputs were all fiber-pigtailed/connectorized. Such use of optical fiber to interconnect multiple discrete components results in sensitivity to environmental disturbances such as mechanical or temperature perturbations, which ultimately cause reduced phase stability. In particular, the use of optical fiber links to interconnect the various components of FIG. 1 makes it difficult to keep the optical path lengths of arms I and II equal or balanced over the long term. Since the length of a section of optical fiber typically can be cleaved to an accuracy of only several millimeters, it is difficult to control and balance the overall path lengths of arms I and II to an accuracy of better than 1–2 cm. Also, because the fibers were not co-located physically, environmental perturbations (such as temperature or mechanical disturbances) could cause differential phase fluctuations between the optical inputs to the slave lasers. Theoretically, the phase noise ($\delta\phi_I$ and $\delta\phi_k$, $|i-k|=n$) of the ith and kth lines in the optical comb generated by a mode-locked laser are given by:

$$\delta\phi_I = (\delta\phi_o)_I + i\delta\phi_R \quad (1)$$

$$\delta\phi_k = (\delta\phi_o)_k + k\delta\phi_R \quad (2)$$

In equation 1 and 2 $(\delta\phi_o)_{I,k}$ and $\delta\phi_R$ are, respectively, the phase fluctuations in the mode-locked laser and the RF-source driving the mode-locked laser. For a high-quality RF source and for lines in the optical comb that correspond to higher order modes of the mode-locked laser, the magnitude of $\delta\phi_o$ is much larger than $\delta\phi_R$. The phase noise of the microwave signal ($f_s=nf_R$) generated via optical heterodyning of diodes 1 and 2 is then given by;

$\delta\phi_{21}(f)=[\delta\phi_I(f)-\delta\phi_k(f)]+$(residual due to the process of injection locking).

If the optical path lengths of arms I and II are identical, then $\delta\phi_o$, i.e. $(\delta\phi_o)_I=i\delta\phi_o$) common to the injection locking of diodes 1 and 2, and $\delta\phi_I(f)-\delta\phi_k(f)=n\delta\phi_R(f)$, where $|i-k|=n$. We thus obtain the minimum value of $[\delta\phi_I(f)-\delta\phi_k(f)]$, and the best phase-noise for the microwave signal $f_s$. From the above discussion, it is obvious that one needs to keep the optical path lengths of 1 and 2 equal and stable to attain the lowest phase noise for the microwave signal $f_s$ that we generate via optical heterodyning. Likewise, optical phase stability in the output paths of DFB lasers 1 and 2 (e.g. from the output of the DFB laser through the associated optical circulator and to the optical combiner) translates into amplitude stability for the optically synthesized microwave signal.

In the prior art described above, it was difficult to maintain differential phase stability between the fiber links of arms I and II. This weakness, in turn, deters the field deployment of the photonic synthesizer described in ref. 1. Therefore, there is a need in the art for a photonic synthesizer which can increase phase stability in different environments.

SUMMARY

Optical heterodyning of the optical outputs of two separate lasers to produce an electronic signal is a technique well known in the art. However, one of the major problems with optical heterodyning, which this invention solves, is the phase drift associated with the optical signals used in and produced for the heterodyning process. This phase drift results in a degradation of the phase and amplitude noise associated with the heterodyned signal.

The present invention provides an integrated optical circuit that enables the stable injection locking of a first and second slave laser to lines in an optical comb generated from a master laser, whose lasing lines are locked in phase. An optical comb is comprised of a series of optical lines, where each of the lines is at a different frequency. By injection-locking the first and second slave lasers to two different lines in the optical comb, and then heterodyning the slave lasers' outputs, one can synthesize microwave signals ($f_s$) over a wide frequency range.

For example, if the master laser is a mode-locked fiber laser, one can synthesize frequencies that range from a minimum frequency equal to the mode-locking frequency of $f_s=f_m$, to a maximum frequency of $f_s$~100 GHz. Specifically, the upper frequency limit of $f_s$ is determined by the spectral width of the mode-locked optical pulses. For this example, the theoretically predicted phase noise (at $f_s$) that one can accomplish using the present invention is the sum of:

(i) the phase noise due to the RF-oscillator (at $f_m$), scaled by the $n^2$-law, where $n=f_s/f_m$, and
(ii) a phase noise incurred by the injection-locking process.

One advantage of the present invention over the prior art lies in the exploitation of integrated optics for the interconnection of the photonic components. Specifically, the splitters, directional couplers, and waveguides of the present invention are all integrated on a common substrate and located close to each other. As mentioned earlier, the theoretically predicted phase noise is the sum of the phase noise due to the RF-oscillator and the phase noise incurred by the injection locking process. As a result, by integrating the components, environmental disturbances such as mechanical vibrations and temperature changes which cause degradations to the amplitude stability and phase noise of the synthesized RF-signal are common to all components, which helps reduce the phase and amplitude instability. Also, because the waveguides to/from the slave lasers are formed on a common substrate and in proximity to each other, the relative phase-drifts between the above components is reduced. Therefore, we can expect long term differential phase stability in the optical injection inputs supplied to the first and second slave lasers. In addition, the two optical signals (the slave laser outputs) to be heterodyned are combined in a common waveguide inside the integrated optical chip. The prior art combines the optical signals using discrete components interconnected by optical fiber, which decreases phase stability.

It is therefore an object of the present invention to provide an integrated optical circuit. The integrated optical circuit is formed on a single substrate, receives an optical comb preferably generated from a mode-locked master laser, and transfers the optical comb to a first and a second slave laser, using a first and a second waveguide path, and a plurality of optical couplers. The first and second slave lasers produce first and second laser outputs which are coupled to an optical coupler using the first and second waveguide paths. The optical coupler combines the first laser output and the second laser output creating at least one combined optical output. The combined optical output is then preferably sent to a primary or secondary output port where the combined optical output can be used for heterodyning.

It is also an object of this invention to use optical couplers instead of Mach-Zender modulators and optical circulators. The optical couplers are preferably 2×2 directional couplers. The use of directional couplers, which have 4 inputs/outputs, provides the integrated optical circuit of this invention with monitoring and control output ports located on the substrate that can be used to monitor chosen characteristics and to implement external control circuits which enhance the performance of the integrated optical circuit.

The directional couplers of this invention as aforementioned, are preferably 2×2 directional couplers, but other optical couplers such as X-junction couplers, or multimode interference couplers could be used as well. The 2×2 directional couplers have two ports on each side of the directional coupler, which can be used as either an input or an output for light. Furthermore each port is not bound to remain as an input or an output permanently. Each port has the ability to function as both an input and an output, depending on whether light is entering or exiting the port. If light enters the port, it is acting as an input, and when light exits the same port, the port is acting as an output. In this way, a 2×2 directional coupler has 4 inputs and 4 outputs, or any combination thereof. A 2×2 directional coupler is well known in the art. However, bi-directional coupler use of a 2×2 directional coupler in which a given port is used as both an input and an output is not a matter of normal routine.

It is also an object of the present invention to provide optical waveguides having substantially shortened lengths. One problem associated with optical heterodyning, which this invention solves, is that as the length of the optical path increases, the phase stability decreases. The prior art as mentioned earlier, uses components that are pigtailed and connected with lengths of optical fiber. It is very likely that when implementing the prior art circuit, it will have lengths of optical-fiber paths that are on the order of meters to 10s of meters long. This is a problem because as mentioned earlier, when the optical path length increases the phase stability decreases. By integrating the components on an integrated optical circuit, it is possible to reduce the optical path length to a length in the range of 6–20 centimeters. This difference in optical path lengths using discrete components and integrating the components is roughly a factor of 100. In addition, it is difficult to integrate all of the components of the prior art circuit on a common substrate. The optical circulators of the prior art are generally bulky items and are especially difficult to integrate.

It is also an object of this invention to provide optical waveguides having substantially equal lengths. This is one advantage of using the present invention over the prior art. In the present invention the integrated optical circuit is created using photolithography techniques, which achieve sub-micron accuracy, to ensure that the two optical paths which carry the two optical signals to be heterodyned are of substantially equal lengths. Also, the components of the integrated optical circuit are completely symmetrical about an axis on that circuit. By creating symmetrical waveguide paths with substantially equal lengths on a common substrate, the phase instability is greatly reduced.

It is also a further object of this invention to provide additional output ports for monitoring and adjusting performance characteristics of the integrated optical circuit. As aforementioned, one advantage to using 2×2 directional couplers is that the directional couplers provide additional output ports. External devices may be connected to these additional output ports, which can monitor and control different characteristics of the integrated optical circuit. One device that may be connected is the a Fabry-Perot etalon, and another is a fixed Fabry-Perot etalon. The Fabry-Perot etalon can be used to monitor the slave lasers' lasing wavelengths and compare them to the desired wavelengths in the optical comb. One or more Fabry-Perot etalons can be connected to a processor that can adjust the slave lasers so that they lase at the desired wavelengths, approximately aligned with the selected wavelengths in the optical comb.

It is also a further object of this invention to provide an integrated optoelectronic module for generation of optical signals for heterodyning to synthesize microwave signals. This integrated optoelectronic module comprises the integrated optical circuit hybrid integrated with one or more injection-power control feedback circuits. The feedback circuit is coupled to one or more of the output ports of the integrated optical circuit. The feedback circuit contains one or more photodetectors that measure the intensity of the optical comb and/or the slave laser output. By monitoring the photocurrents, the feedback circuit can adjust the power level of the optical-comb light that is injected into a slave laser as well as the relative optical-power levels of the two slave-laser outputs as they are combined for heterodyning.

It is also a further object of this invention to provide heterodyne and homodyne phase lock loops for monitoring and adjusting the integrated optical circuit. The heterodyne and homodyne phase lock loops are coupled to the output ports of the integrated optical circuit. The heterodyne phase lock loop is used to ensure that the beat frequency of the slave lasers is kept constant. If the beat frequency changes, the heterodyne phase lock loop provides a feedback system that can adjust one of the slave lasers and regain the desired beat frequency. A homodyne phase lock loop is used to adjust the lasing wavelength of the other slave laser to match a selected line in the optical comb. If the lasing wavelength of that slave laser changes, the homodyne phase lock loop provides feedback that readjusts that slave laser to lase at the desired wavelength in the optical comb. Furthermore, by using homodyne and heterodyne phase lock loops with an integrated optical circuit, loop bandwidths on the order of 10s of KiloHertz can be achieved. In contrast, homodyne and heterodyne phase lock loops comprising discrete components connected by optical fiber only achieve loop bandwidths on the order of 100s of Hertz.

In summary, the integrated optical circuit of this invention, which has optical waveguides, a splitter and directional couplers formed on the same chip, allows us to:

(i) have a much more compact physical size, for reduced sensitivity to environmental perturbations;
(ii) form a feedback circuit that will modify the power injected to each DFB laser for optimal injection locking;
(iii) ensure that the power of each of the combined laser output signals going to the output ports for heterodyning is equal, for increased efficiency of frequency synthesis; and
(iv) have shorter optical and electrical delays for improved phase locking using phase-lock loops.

As a result, synthesized signals will have increased phase and amplitude stability.

BRIEF DESCRIPTION OF THE DRAWINGS

FIG. 3 shows a block diagram showing the path of the optical comb and the first and second laser output according to the present invention;

FIG. 7 shows a hybrid integration approach for constructing the integrated optoelectronic module of the present invention.

DETAILED DESCRIPTION OF PREFERRED EMBODIMENTS

Figure 1:
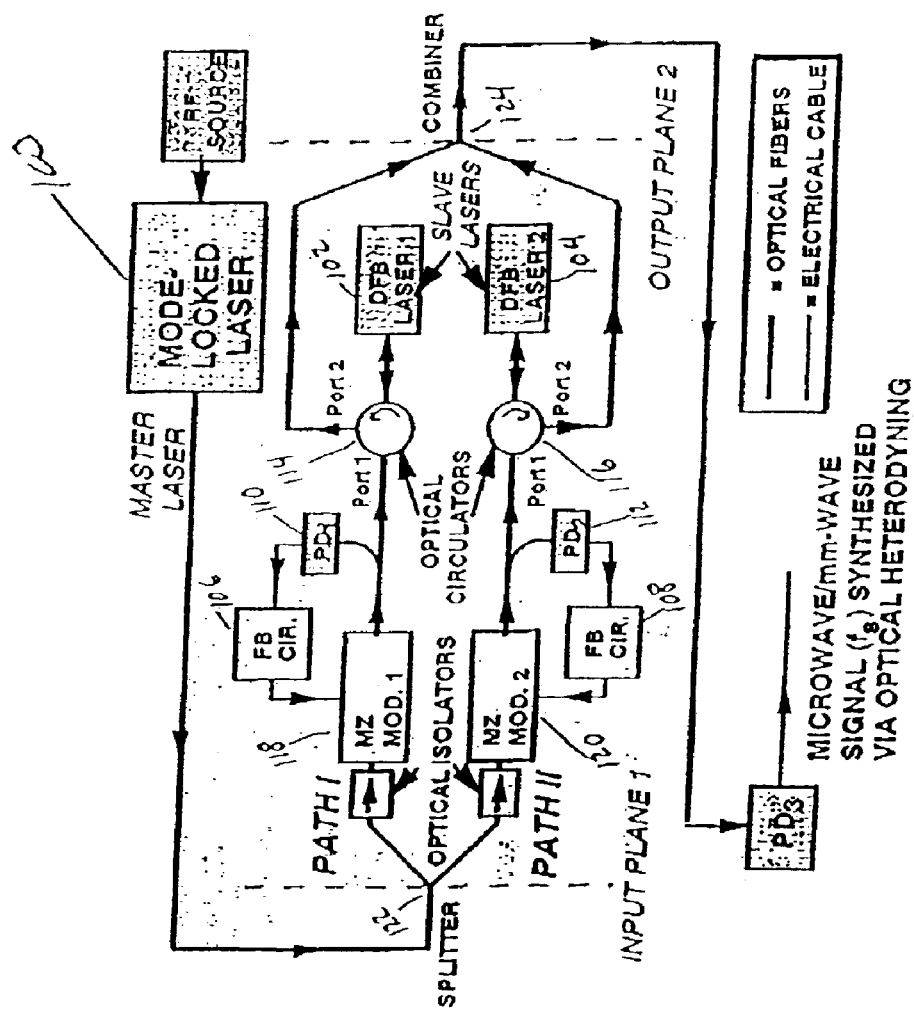
FIG. 1 shows a photonic synthesizer according to the prior art.

The present invention will now be described more fully hereinafter with reference to the accompanying drawings, in which preferred embodiments of the invention are shown. This invention may be embodied in many different forms and should not be construed as limited to the embodiments set forth herein.

An apparatus for generating a microwave signal by optical heterodyning that has improved phase and amplitude stability according to a first embodiment of the present invention is described with reference to FIG. 2a, FIG. 2b, and FIG. 3, blocks 2–28. This apparatus comprises an integrated optical circuit, illustrated in FIG. 2a. Use of the integrated optical circuit to form a photonic synthesizer of microwave signals is illustrated in FIG. 2b. In this apparatus, an integrated optical circuit 201 couples optical energy from a master laser 203 to a first and second slave laser 216, 218. The integrated optical circuit 201 contains two ports 219, 221 at which the first and second slave lasers 216, 218 are butt coupled to the integrated optical circuit 201. The first and the second slave laser 216, 218 each receive the optical energy.

The first slave laser 216 produces a first laser output based on the physical characteristics of the first slave laser 216 and the received optical energy. The second slave laser 218 produces a second laser output based on the physical characteristics of the second slave laser 218 and the received optical energy. The first and second laser outputs are then combined in a directional coupler 222 creating a primary and a secondary combined laser output. The primary combined laser output is sent to at least one primary output port 220 where the primary combined laser output can be used for heterodyning. The secondary combined laser output is preferably also sent to one or more secondary output ports 230 on the integrated optical circuit 201, where the secondary combined laser output can be used for monitoring or feedback control.

The components of the integrated optical circuit 201 consist of an optical splitter 202, preferably a 1:2 optical splitter, a first directional coupler 212, a second directional coupler 214, a combining directional coupler 222, and lengths of optical waveguide that interconnect those components with each other and with input/output ports of the integrated optical circuit 201. First and second directional couplers 212, 214 and the combining directional coupler 222 each have two sides with two ports on each side. The directional couplers can conduct light from the master laser 203 to the first and second slave laser 216, 218, hereinafter referred to as the forward direction, as well as from the first and second slave laser 216, 218 to the primary output port 220 and the secondary output port 230, hereinafter referred to as the reverse direction. A directional coupler is a well-known device in the art. It can be adjusted electrically to split the light from either one of its inputs into its outputs according to a selected ratio. It is preferred to have the powers of the first and second laser outputs be equal as they are combined and delivered to the primary output port 220 for more efficient heterodyning. This can be accomplished by adjusting the first and second directional coupler 212, 214 and the combining directional coupler 222. First and second directional coupler 212, 214 also can be adjusted to achieve the desired optical powers $P_i$ of the optical comb injected into first and second slave lasers 216, 218, respectively. The integrated optical circuit 201 is preferably constructed from a GaAs, $LiNbO_3$, InP, or Si substrate. For this invention, we prefer to use 2×2 directional couplers for the first, second, and combining directional couplers 212, 214, 222.

The components of the apparatus are connected by a first waveguide path 215, and a second waveguide path 217. The first waveguide path 215 is formed between one of the two outputs of optical splitter 202, the first directional coupler 212, and the first slave laser 216. The first waveguide path 215 also includes the lengths of optical waveguide that interconnect the combining directional coupler 222, and the first slave laser 216. A second waveguide path 217 is formed between the other of the two outputs of optical splitter 202, the second directional coupler 214, and the second slave laser 218. The second waveguide path 217 also includes the lengths of optical waveguide that interconnect the combining directional coupler 222, and the second slave laser 218.

The master laser 203 of the apparatus 200 is preferably a mode-locked laser. The optical energy generated by the master laser 203 is preferably an optical comb, which is a series of optical lines at different frequencies. The spacing between the lines is determined by a RF oscillator 260 (shown in FIG. 6b), which drives the master laser 203. The output of the master laser 203 is sent through an optical isolator 205 to prevent reflected power from destabilizing the optical comb.

The first and second slave laser 216, 218 of the apparatus are preferably distributed feedback (DFB) lasers. The first and second slave laser 216, 218 are preferably each tuned to a different optical line of the optical comb. By tuning the first and second slave laser 216, 218 to different optical lines, they produce a first and second laser output, which when combined, can then be used to generate a microwave signal by optical heterodyning.

For the embodiments of this invention, described in FIGS. 2–7, the optical splitters, waveguides and directional couplers formed on integrated optical circuit 201 are preferably manufactured using photolithography, which has submicron accuracy. This ensures that the first and second waveguide paths 215, 217 are of substantially equal lengths. Also, the components of the integrated optical circuit 201 are preferably laid out in a symmetrical fashion, with the axis of symmetry shown by the dashed line in FIGS. 2a, 2b, 4, 6a and 6b. This is another technique to help ensure that the first and second waveguide paths 215, 217 are of equal length.

The transverse spacing between any two sets of directional couplers, for example the first and second directional coupler 212, 214 of the integrated optical circuit 201, that are placed in parallel can be as small as approximately 0.05–0.10 mm and still ensure that those directional couplers do not interact with each other, except through their inputs and outputs. Thus, the maximum separation between the first and second waveguide paths 215, 217 of the embodiment shown in FIGS. 2a and 2b can be as small as 0.2 mm. Similarly, the maximum transverse separation between the first and second waveguide paths 215, 217 of the embodiments shown in FIGS. 4, 6a and 6b can be as small as 0.4 mm, but is generally less than 10 mm. This close proximity of the first and second waveguide paths 215, 217 ensures that they see the same environment, which results in improved phase stability.

Figure 2A:
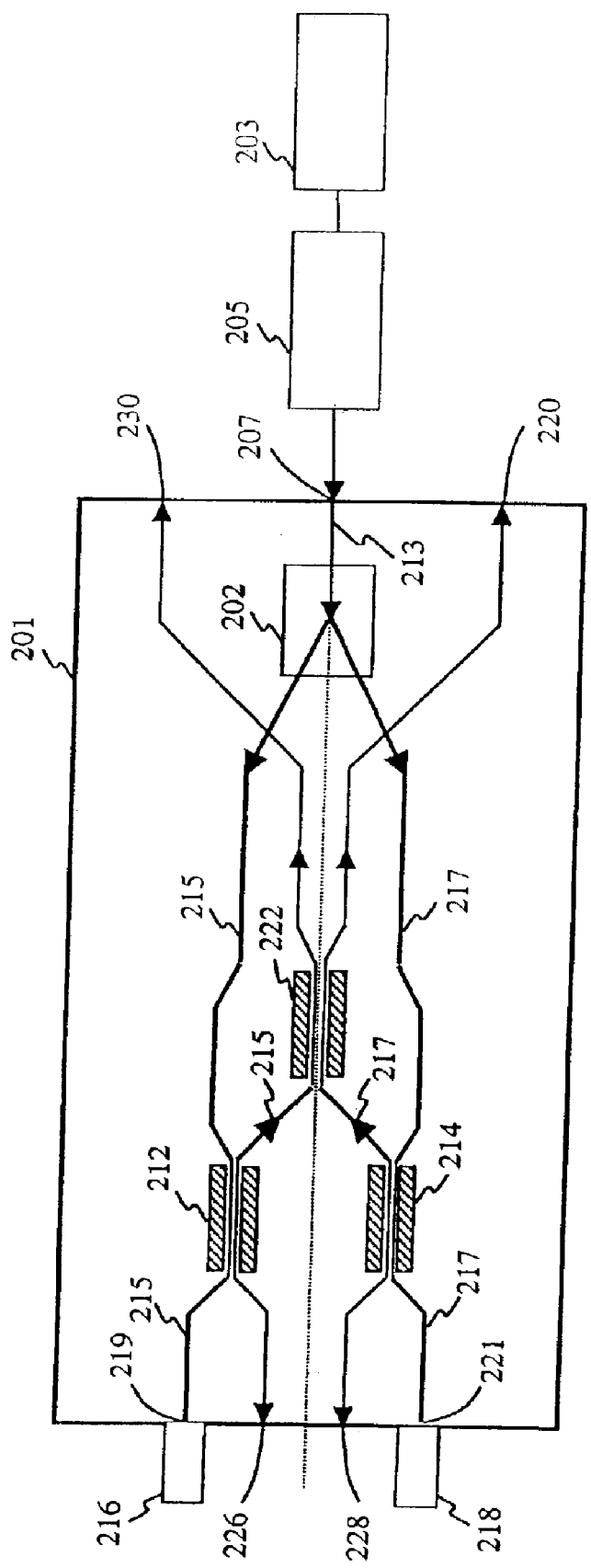
FIG. 2a shows an integrated optical circuit according to the present invention.
Figure 2B:
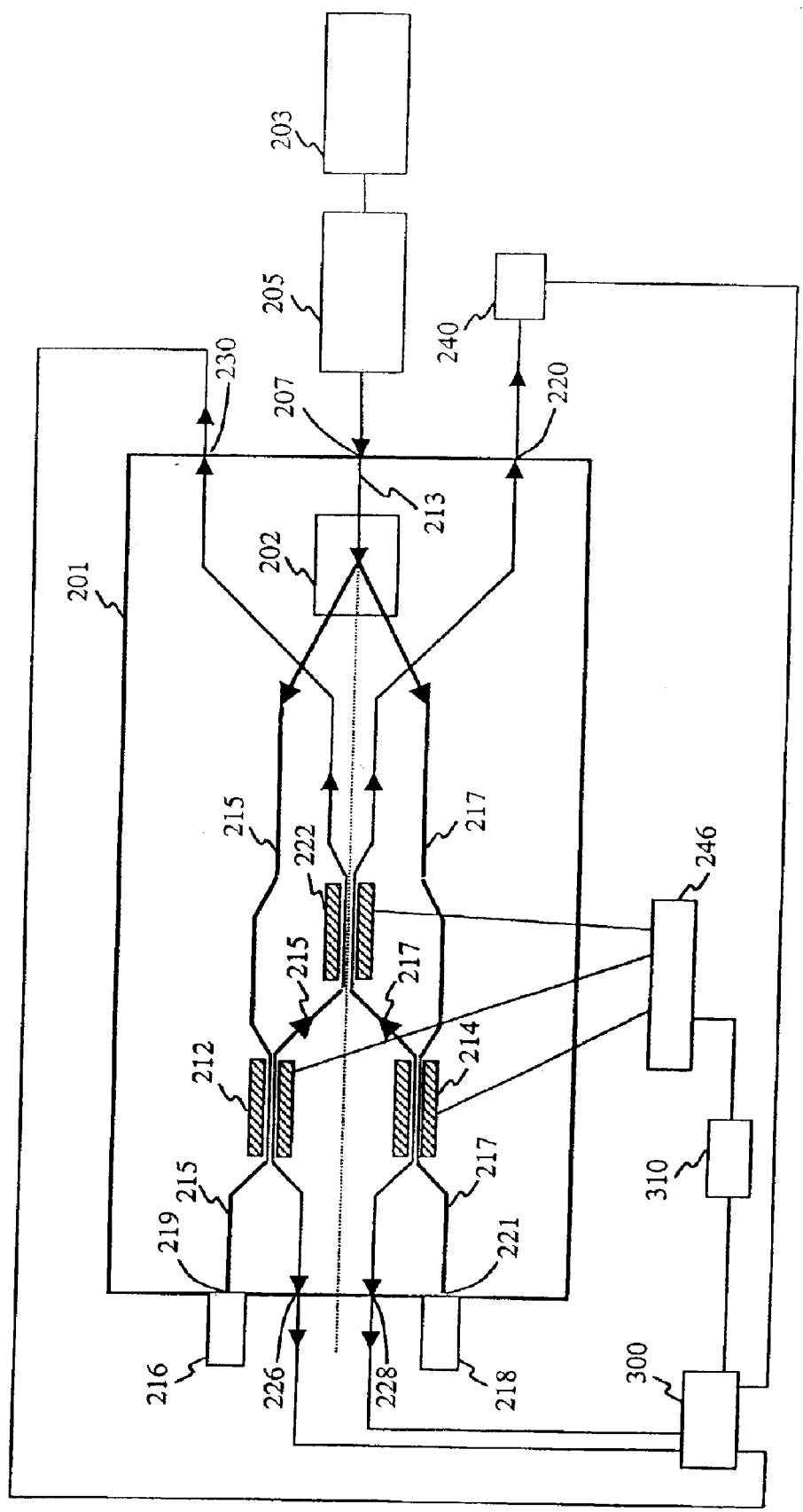
FIG. 2b shows a photonic microwave synthesizer based on the integrated optical module according to the present invention.

Referring now to FIG. 3, blocks 1–28, the path of the optical comb and the first and second optical output can be followed throughout the apparatus shown in FIG. 2a. The optical comb generated by the master laser 203 (See block 2) first goes through an optical isolator 205 (See block 4) to prevent power from being reflected. The optical comb enters the integrated optical circuit 201 at an input port 207 to a center waveguide 213 (See block 6). After entering the integrated optical circuit 201 through center waveguide 213 (See block 6), the optical comb enters the optical splitter 202 where the optical comb is divided between two outputs of the optical splitter 202 (See block 8) into first and second waveguide paths 215, 217. The first and second waveguide paths 215, 217 carry the optical comb to the first and second slave laser 216, 218, respectively, traveling through first and second directional coupler 212, 214, respectively. The first and second slave laser 216, 218 generate a first and second laser output. The first and second waveguide paths 215, 217 carry the first and second laser output from first and second slave laser 216, 218 to the combining directional coupler 222, again traveling through first and second directional coupler 212, 214, respectively.

The divided optical comb from optical splitter 202 enters the first and second directional coupler 212, 214 (See blocks 10,12). Both the first and second directional coupler 212, 214 each split the optical comb into two outputs. The first and second directional coupler 212, 214 each have an output that is connected to the first and second slave laser 216, 218, respectively. The other output of first and second directional couplers 212, 214 are connected to output ports 226, 228 (See blocks 14, 16), respectively. The output ports 226 or 228 could, for example, be used to couple the optical comb to Fabry-Perot etalons, which monitor the alignment of the lasing wavelength of the first and second slave laser 216, 218 to the desired lines in the optical comb. The optical comb that leaves the first directional coupler 212 enters the first slave laser 216, and the optical comb that leaves the second directional coupler 214 enters the second slave laser 218 (See blocks 18, 20). The first slave laser 216 is adjusted so that its emission is at a desired line in the optical comb. Likewise, the second slave laser 218 is adjusted so that its emission is at, a usually different, desired line in the optical comb, thereby producing a first and second laser output, respectively. The first laser output reenters the first directional coupler 212 (See block 22), and the second optical output reenters the second directional coupler 214 (See block 24). The first directional coupler 212 splits the first laser output into two portions; one portion is supplied to a combining directional coupler 222 (See block 26) through an output of the first directional coupler 212. The second directional coupler 214 likewise splits the second laser output into portions; one portion being supplied to the combining directional coupler 222 (See block 26) through an output of second directional coupler 214. The first and second laser outputs that enter the combining directional coupler 222 (See block 26) are combined to form a primary and a secondary combined laser output. The primary combined output is then sent to a primary output port 220 on the integrated optical circuit 201 (See block 28), where the signal can be used for heterodyning to generate the microwave signal. It is preferred that in the primary combined output, the power of the first laser output be equal to the power of the second laser output. This can be achieved by adjusting the combining directional coupler 222, as well as the first and second directional coupler 212, 214. The secondary combined output can be sent to a secondary output port 230 on the integrated optical circuit 201.

In an alternate embodiment, as shown in FIG. 2b, the relative splitting of light between the two outputs each of first and second directional coupler 212, 214 and combining directional coupler 222 can be controlled electrically. This control permits the first, second, and combining directional coupler 212, 214, 222 to be set to obtain the desired optical powers $P_i$ of the optical comb injected into the first and second slave lasers 216, 218. This control permits the first, second, and combing directional coupler 212, 214, 222 to also be set to obtain equal powers of the first and second laser outputs in the primary combined laser output of the integrated optical circuit 201. This embodiment makes use of the output ports 226, 228 and the secondary output port 230 of the integrated optical circuit. The output ports 226, 228, and the secondary output port 230 are coupled to optical fibers and supplied to an optical spectrum analyzer (OSA) 300 that may contain at least one scanning Fabry Perot etalon. A portion of the primary combined laser output also may be coupled, by means of an additional optical fiber splitter 240, into the OSA 300. The OSA 300 monitors the amplitudes and frequencies of individual lines of the optical comb and also of the first and second slave laser outputs. This information is then supplied to a processor 310 and to a directional coupler controller 246 for controlling the first and second directional coupler 212, 214 and the combining directional coupler 222.

Once a directional coupler is set to achieve a particular splitting of light from one of its inputs into its two outputs, the light from the other input also is set. In addition, that setting applies for light traveling in either direction, both forward and reverse. In general, the settings of the first and second directional couplers 212, 214 will be determined by the desired optical powers Pi of the optical comb injected into first and second slave lasers 216, 218. The setting of the combining directional coupler 222 is then determined by the desire to obtain equal powers of the first and second laser outputs in the primary combined laser output which is supplied to the primary output port 220 of the integrated optical circuit. This means that the secondary combined laser output supplied to the secondary output port 230 of the integrated optical circuit may not have equal powers of the first and second laser outputs.

Figure 4:
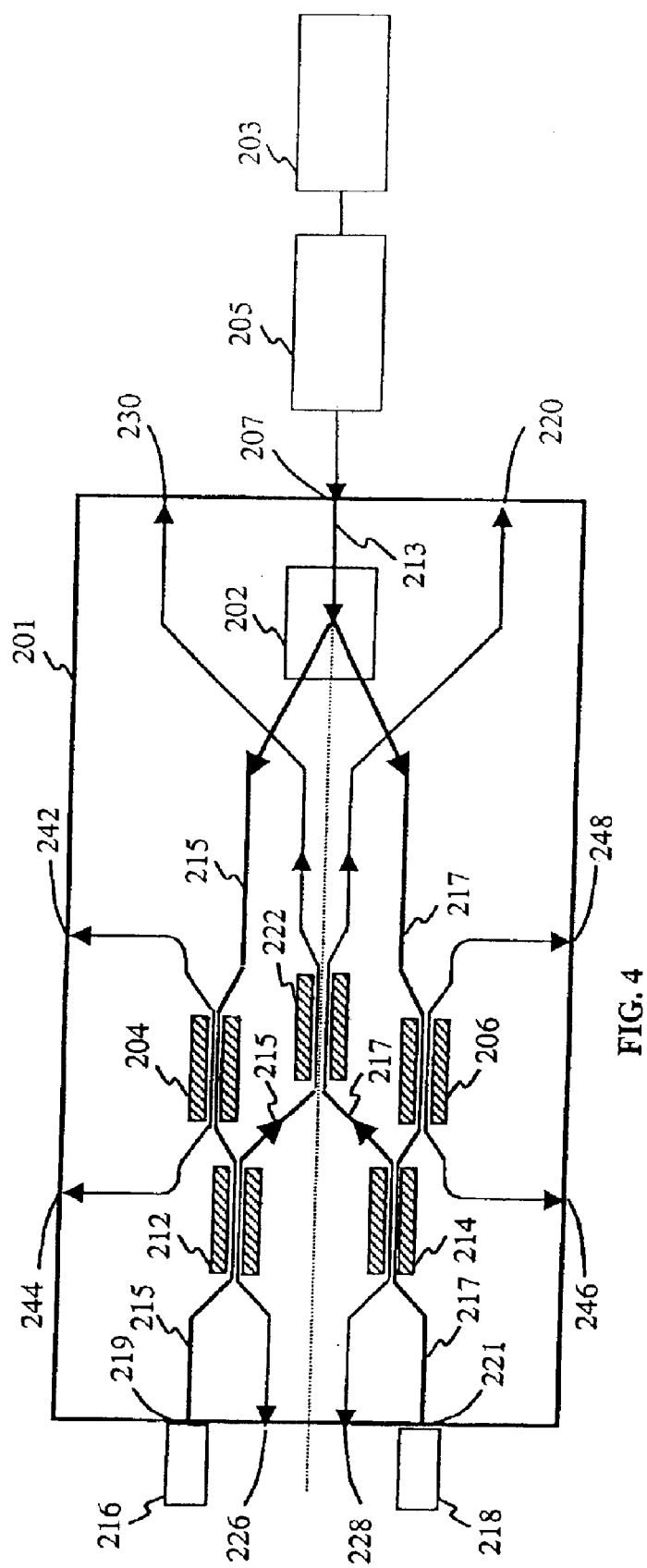
FIG. 4 shows the integrated optical circuit according to an alternate embodiment of the present invention.

Another alternate embodiment of the present invention is shown in FIG. 4. In this embodiment, the components of the integrated optical circuit 201 comprise the optical splitter 202, the first directional coupler 212, the second directional coupler 214, the combining directional coupler 222, a third directional coupler 204, and a fourth directional coupler 206. The first and second waveguide paths 215, 217 interconnect these components to each other output ports 215, 217 of the integrated optical circuit 201.

This embodiment is similar to the one shown in FIG. 2a but has two additional directional couplers, a third directional coupler 204 and a fourth directional coupler 206. These additional directional couplers 204, 206, when used in combination with the first and second directional couplers 212, 214, permit the control of optical powers $P_i$ of the optical comb injected into first and second slave lasers 216, 218 as well as the attainment of equal powers of the first and second laser outputs in the primary combined laser output of the integrated optical circuit 201. This control can be achieved without needing to use an OSA 300 for controlling the first and second directional coupler 212, 214. Instead, an integrated optoelectronic module 250 (shown in FIG. 6a and 6b) can be constructed from the integrated optical circuit 201 of this embodiment for generating a microwave signal by heterodyning. An OSA 300, however, can still be used for monitoring the optical comb and the first and second laser outputs. An OSA 300 also can still be used for controlling the emission wavelengths of the first and second slave lasers 216, 218 so that they coincide with the selected lines of the optical comb. Again, in this embodiment, we prefer to use 2×2 third and fourth directional couplers 204, 206.

The third and fourth directional couplers 204, 206 each have two ports on each side of the directional coupler, which may act as either inputs or outputs. The third directional coupler 204 is connected between one output of splitter 202 and an input of first directional coupler 212 that was associated with that output of splitter 202 in the prior embodiment. The fourth directional coupler 206 is connected between the other output of splitter 202 and the input of second directional coupler 214 that was associated with that output of splitter 202 in the prior embodiment. One input of third and fourth directional coupler 204, 206 for light traveling in the forward direction is connected to splitter 202. One output of third and fourth directional coupler 204, 206 for light traveling in the forward direction is connected to first and second slave laser 216, 218. Note that the output of third and fourth directional coupler 204, 206 for the optical comb traveling in the forward direction acts as an input for the first and second laser output, which travel in the reverse direction through the third and fourth directional coupler 204, 206. The third and fourth directional coupler 204, 206 also each have another output for coupling the optical comb, traveling in the forward direction through the coupler, to output ports 244, 246, respectively. The third and fourth directional couplers 204, 206 are also each coupled to another output port 242, 248 for providing a portion of the first and second laser output, which travels in the reverse direction through the third and fourth directional coupler 204, 206.

Figure 5:
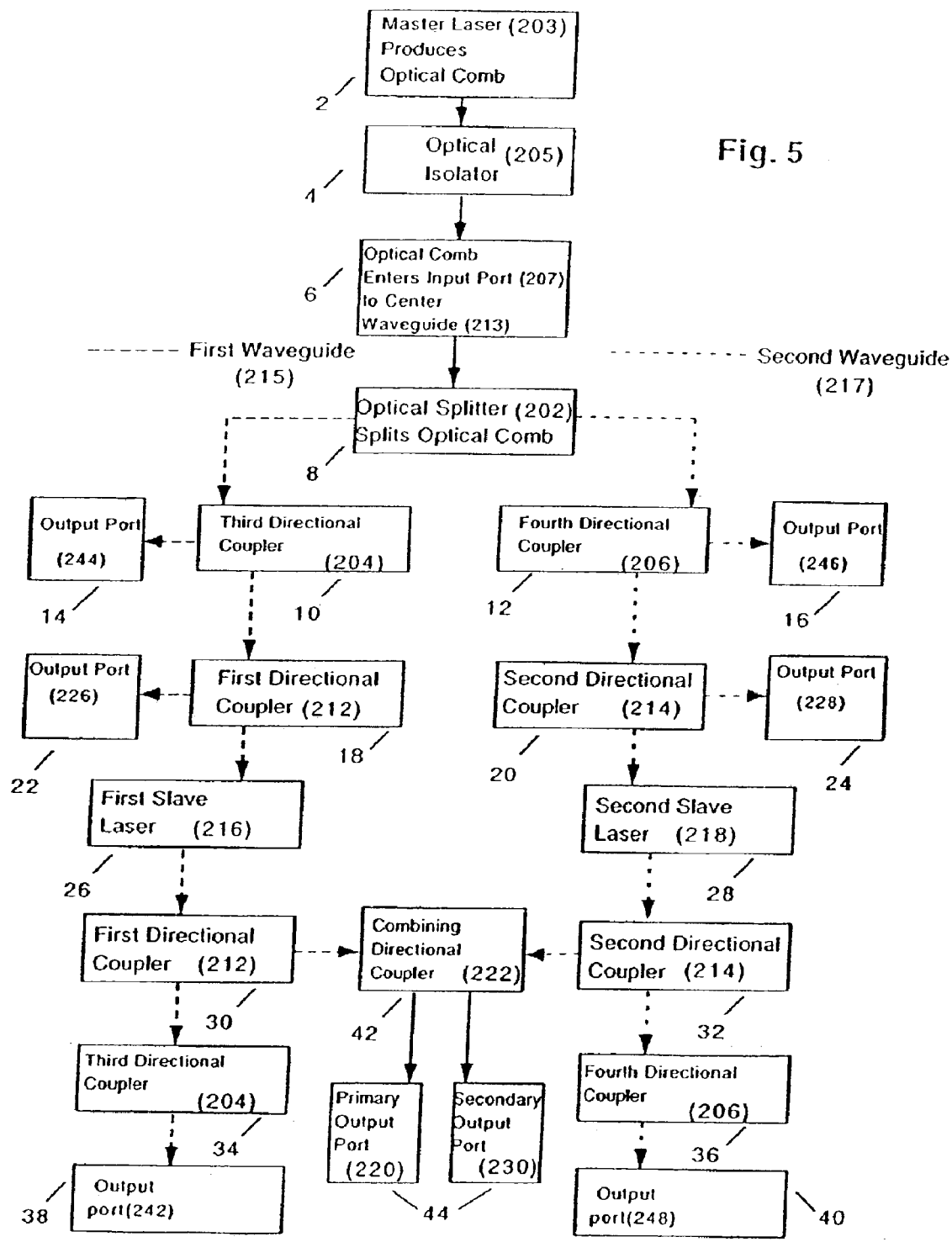
FIG. 5 shows a block diagram showing the path of the optical comb and the first and second laser output according to an alternate embodiment of the present invention.
Figure 6A:
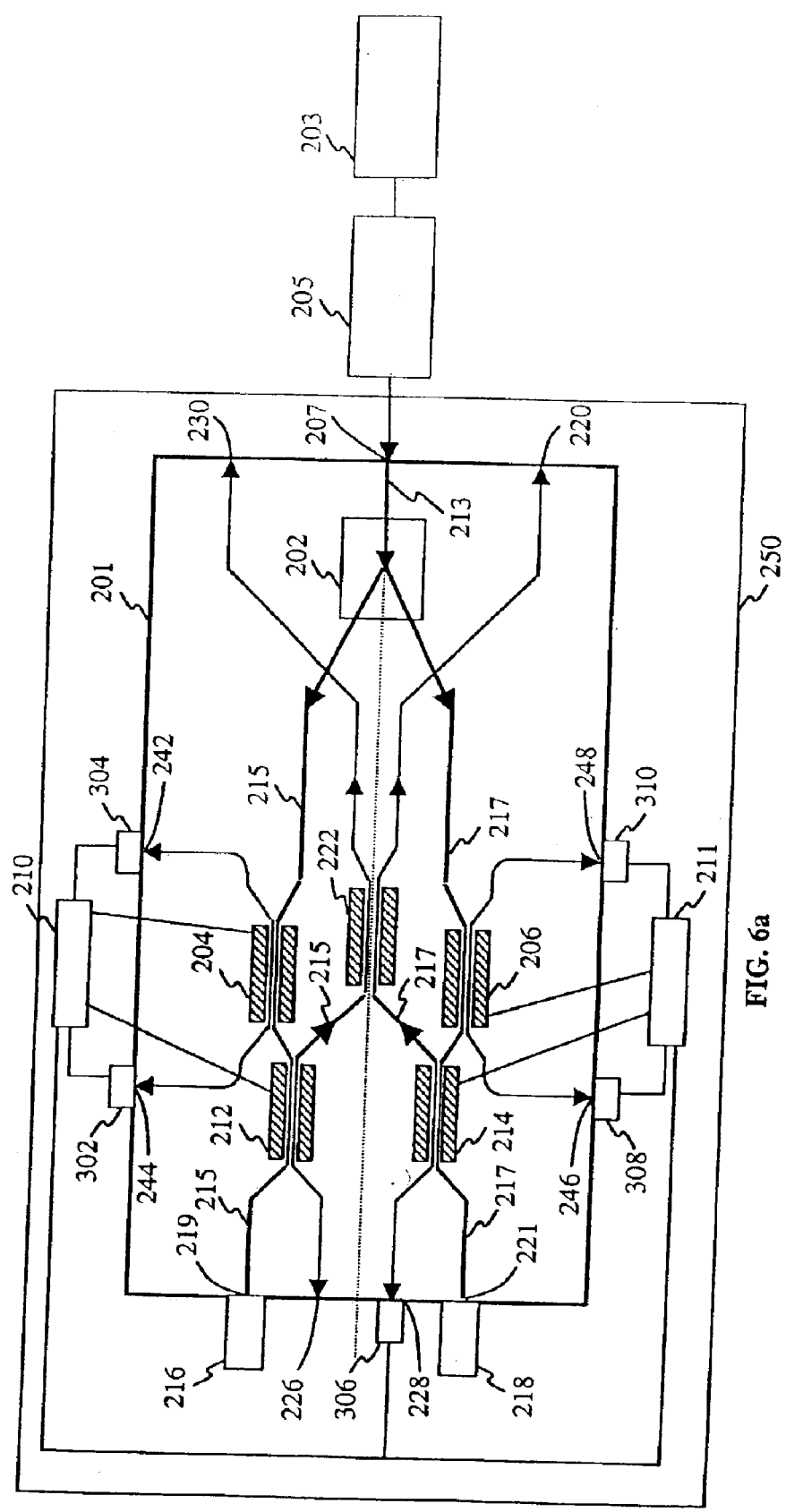
FIG. 6a shows an integrated optoelelectronic module for photonic microwave synthesis according to an alternate embodiment of the integrated optical circuit.
Figure 6B:
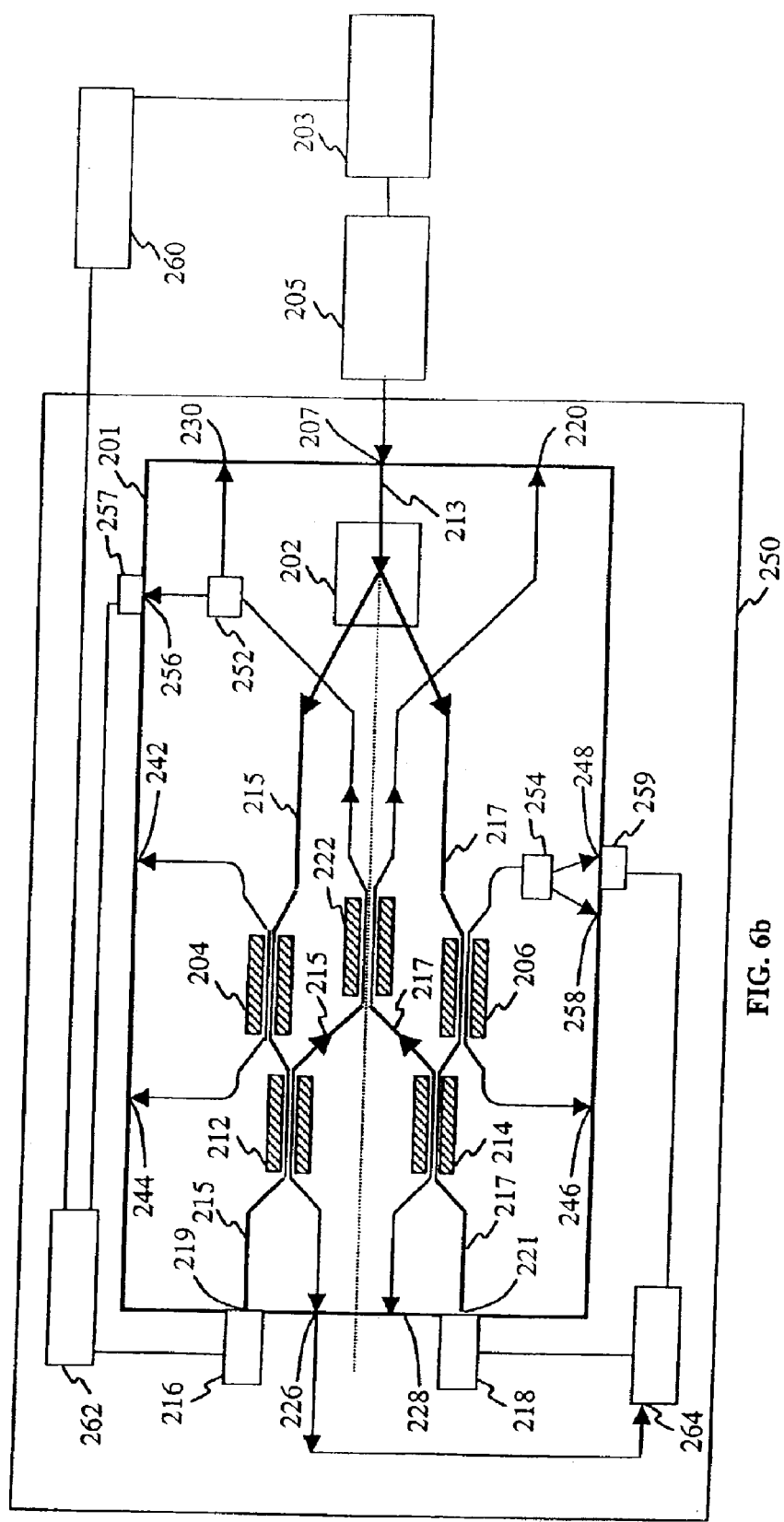
FIG. 6b shows an alternate embodiment of the integrated optoelelectronic module for photonic microwave synthesis according to an alternate embodiment of the integrated optical circuit.

FIG. 5 blocks 2–44 show the path of the optical comb and the first and second laser output in this alternate embodiment. FIGS. 6a and 6b show additional components that may be coupled to the various output ports of this alternate embodiment. Some of these additional components are photodetectors that are part of control circuits and phase-lock loop circuits. Scanning Fabry-Perot etalons can be connected to the monitoring and control output ports for monitoring the optical comb and the first and second laser output.

As shown in FIG. 5, the optical comb generated by the master laser 203 (See block 2), first goes through the optical isolator 205 (See block 4) to prevent power from being reflected. The optical comb enters the integrated optical circuit 201 at input port 207 to a center waveguide 213 (See block 6). After entering the integrated optical circuit 201 through center waveguide 213 (See block 6), the optical comb enters the optical splitter 202, where the optical comb is divided between two outputs of the optical splitter (See block 8) into a first and second waveguide path 215, 217. The divided optical comb then enters inputs of third and fourth directional coupler 204, 206 (See blocks 10,12). A portion of the optical comb leaving the third directional coupler 204 is directed to the output port 244 (See block 14). A portion of the optical comb leaving the fourth directional coupler 206 is directed to another output port 246 (See block 16). The output ports 244, 246 may be used to connect photodetectors and feedback circuits. The photodetectors and feedback circuits may be used for adjusting the power of the optical comb injected into the first and second slave lasers 216, 218. The optical powers $P_i$ of the optical comb injected into first and second slave lasers 216, 218 and the detuning of those slave lasers from the selected lines of the optical comb determine the phase noise associated with the optical injection locking process, as is known in the art.

The third directional coupler 204 has an output for sending a portion of the optical comb to an input of the first directional coupler 212 (See block 18), and the fourth directional coupler 206 has an output for sending the optical comb to an input of the second directional coupler 214 (See block 20). Both the first and second directional coupler 212, 214 have an output connected to an output port 226, 228 for monitoring the optical comb power injected into slave laser 216, 218 (See blocks 22, 24). The output port 226, 228 could, for example, be used to connect to Fabry-Perot etalons. The output port 226, 228 also could be connected to a photodetector, which is a part of feedback circuit. The optical comb that leaves the first and second directional coupler 212, 214, also enters the first slave laser 216 and the second slave laser 218 (See blocks 26, 28). The first and second slave laser 216, 218 are adjusted so that they lase at wavelengths coincident with the desired lines in the optical comb. The first and second slave laser 216, 218 produce a first and second laser output, respectively. The first laser output reenters an input of the first directional coupler 212 (See block 30), and the second laser output reenters an input of the second directional coupler 214 (See block 32), in the reverse direction. After being split by the first directional coupler 212, a portion of the first laser output leaves an output of the first directional coupler 212, and reenters an input of the third directional coupler 204 (See block 34), in the reverse direction, and the remaining portion of the first laser output enters the combining directional coupler 222 (See block 42). After being split by the second directional coupler 214, a portion of the second laser output leaves an output of the second directional coupler 214, and enters the combining directional coupler 222 (See block 42), and the remaining portion of the second laser output reenters an input of the fourth directional coupler 206 (See block 36). A portion of the first and second laser outputs that reentered the third and fourth directional coupler 204, 206 leaves an output of the third and fourth directional coupler 204, 206 and is then coupled to output ports 242, 248 of the integrated optical circuit 201 (See blocks 38, 40). These output ports 242, 248 can be coupled to photodetectors that are a part of a feedback circuit. The portion of the first and second laser outputs that enter the combining directional coupler 222 (See block 42) are combined to form a primary combined laser output and a secondary combined laser output. The primary combined laser output signal is then sent to the primary output port on the integrated optical circuit (See block 44), where the signal can be used for heterodyning to generate the microwave signal. The secondary combined laser output is sent to the secondary output port 230 (See block 44), where the secondary combined laser output may be used for heterodyning.

According to this alternate embodiment, a first waveguide path 215 is formed between one of the two outputs of optical splitter 202, the third directional coupler 204, the first directional coupler 212, and the combining directional coupler 222. The first waveguide path 215 interconnects those components with each other and with first slave laser 216. A second waveguide path 217 is formed between the other of the two outputs of optical splitter 202, the fourth directional coupler 206, the second directional coupler 212, and the combining directional coupler 222. The second waveguide path 217 interconnects those components with each other and with second slave laser 218.

An integrated optoelectronic module 250 can be constructed from the embodiment, described above, of the integrated optical circuit 201 illustrated in FIG. 4. A example of the integrated optoeletronic module is shown in FIG. 6a. This example contains feedback circuits for controlling the directional couplers. The integrated optoelectronic module 250 comprises the integrated optical circuit 201 and a first and second feedback circuit 210, 211. First feedback circuit 210 controls first directional coupler 212 and third directional coupler 204. Second feedback circuit 211 controls second directional coupler 214 and fourth directional coupler 206. First feedback circuit 210 also contains first photodetector 302, for detecting photocurrent intensity of the optical comb, third photodetector 304, for detecting the photocurrent intensity of the first laser output, and fifth photodetector 306. The first, third and fifth photodetectors 302, 304, 306 are coupled to output ports 242, 244 and 226 of the integrated optical circuit. Second feedback circuit 211 contains second photodetector 308, for detecting the photocurrent intensity of the optical comb, fourth photodetector 310, for detecting the photocurrent intensity of the second laser output, and fifth photodetector 306. The second, fourth and fifth photodetectors 308, 310, 306 are coupled to output ports 246, 248, and 228 of the integrated optical circuit 201. The first and second feedback circuit 210, 211 monitor the optical comb power coupled into the first and second slave laser 216, 218 and the first and second laser output from first and second slave laser 216, 218 that is delivered to the combining directional coupler 222. First feedback circuit 210 then electrically adjusts the first and third directional coupler 212 and 204, and second feedback circuit 211 electrically adjusts the second and fourth directional coupler 214 and 206, to obtain the desired levels of optical power $P_i$ of the optical comb injected into first and second slave lasers 216, 218, respectively. The first, second, third, and fourth directional couplers 212, 204, 214, 206 also are electrically adjusted to obtain equal powers for the first and second slave laser outputs that are delivered to the combining directional coupler 222. The combining directional coupler in this embodiment is nominally set to be a 3-dB splitter, which divides the power evenly between its two outputs.

In yet another alternate embodiment of this invention, as shown in FIG. 6b, heterodyne and homodyne phase lock loops are connected to the integrated optical circuit 201 to construct an integrated optoelectronic module 250. The function and benefits of heterodyne and homodyne phase lock loops for optical-heterodyne microwave synthesis using injection-locked slave lasers is discussed in a related patent application document entitled "Low-Noise, Switchable RF-Lightwave Synthesizer," Ser. No. 60/373,739 which is filed on even date herewith. The process of generating a frequency-converted microwave signal by optical heterodyning also is discussed in this related patent application. Although an integrated optoelectronic module 250 with heterodyne and homodyne phase lock loops and with feedback circuits for controlling the directional couplers are described separately herein. That separation is done only for purposes of clarity. An integrated optoelectronic module 250 of this invention could contain heterodyne and homodyne phase lock loops as well as feedback circuits for controlling the directional couplers.

The integrated optical circuit 201 shown in FIG. 6b is similar to the integrated optical circuit 201 shown in FIGS. 4 and 6a with the following exceptions. The integrated optical circuit 201 of FIG. 6b has two additional optical splitters 252 and 254, two additional output ports 256 and 258, and additional waveguides that connect the additional optical splitters 252, 254 to the additional output ports 256, 258. Splitter 252 receives the secondary combined laser output from combining directional coupler 222 and splits the secondary combined laser output into two signals that are provided to the secondary output port 230 and output port 256 of the integrated optical circuit 201. Splitter 254 receives a portion of the second laser output from fourth directional coupler 206 and splits that second laser output signal into two signals that are provided to output ports 248 and 258 of the integrated optical circuit 201.

Photodetector 257 is a part of a heterodyne phase lock loop 262 that is coupled to output port 256. Heterodyne phase lock loop 262 is described in more detail in the related patent application document entitled "Low-Noise, Switchable RF-Lightwave Synthesizer," Ser. No. 60/373,739. The heterodyne phase lock loop 262 is electrically connected to the first slave laser 216 to provide fine control of the current driving first slave laser 216. An external RF reference oscillator 260 is connected to both the heterodyne phase lock loop 262 and the mode-locked master laser 203. The purpose of this external reference oscillator 260 also is discussed in the referenced related patent application document.

Photodetector 259 is a part of a homodyne phase lock loop 264 that is coupled to output port 258. Homodyne phase lock loop 264 is also coupled to output port 226 to receive the optical comb. Homodyne phase lock loop 264 also is described in more detail in the above referenced related patent application document. The homodyne phase lock loop 264 is electrically connected to the second slave laser 218 to provide fine control of the current driving second slave laser 218.

A hybrid integration approach for constructing the integrated optoelectronic module 250 of FIGS. 6a and 6b is illustrated in FIG. 7. The integrated optical circuit 201, and photodetectors for first and second feedback circuits (not shown) as well as for the heterodyne phase lock loop (not shown) and the homodyne phase lock loop (not shown) are mounted on a common substrate platform 270. FIG. 7 shows a portion of the integrated optoelectronic module 250 and integrated optical circuit 201. FIG. 7 also shows, as an example, first slave laser 216 coupled to port 219, a V-shaped groove 272 for aligning an optical fiber (not shown) to output port 226 of the integrated optical circuit 201 and a photodetector 306 coupled to another output port 228 This substrate platform 270 could be fabricated from a variety of materials, such as silicon, glass, III-V semiconductors (e.g. InP or GaAs) or metals (e.g. copper). V-shaped grooves 272 can be machined into the substrate platform 270 using known techniques and aligned with the integrated optical circuit 201 using other known techniques. These V-shaped grooves 272 serve to hold and align optical fibers that are coupled to input port 207, (shown in FIG. 4) and primary output port 220, secondary output port 230 and output port 226 of the integrated optical circuit (as shown in FIG. 4). First and/or second slave lasers 216, 218 also can be mounted on substrate platform 270 and aligned to first and second waveguide paths 215, 217, (as shown in FIG. 4) of integrated optical circuit 201. Photodetectors 302, 304, 306, 308, 310, 257, and 259 also can be mounted on substrate platform 270 and aligned to their respective output ports of the integrated optical circuit 201.

A micro-lens or tapered-waveguide mode-expander can be used to accomplish mode-matching between the first and second slave laser 216, 218 and the first and second waveguide path 215, 217 (not shown) on integrated optical circuit 201. The lens and mode-expander also can be formed on the integrated optical circuit 201 chip or on the first and second slave laser 216, 218 chip. The lens also can be formed as a physically separate unit that is mounted on the substrate platform 270 between first and second slave laser 216, 218 and integrated optical circuit 201. Alignment features (not shown) that are known in the art can be machined into substrate platform 270 to assist in the alignment of first and second slave laser 216, 218 to first and second waveguide path 215, 217 of integrated optical circuit 201.

Figure 8:
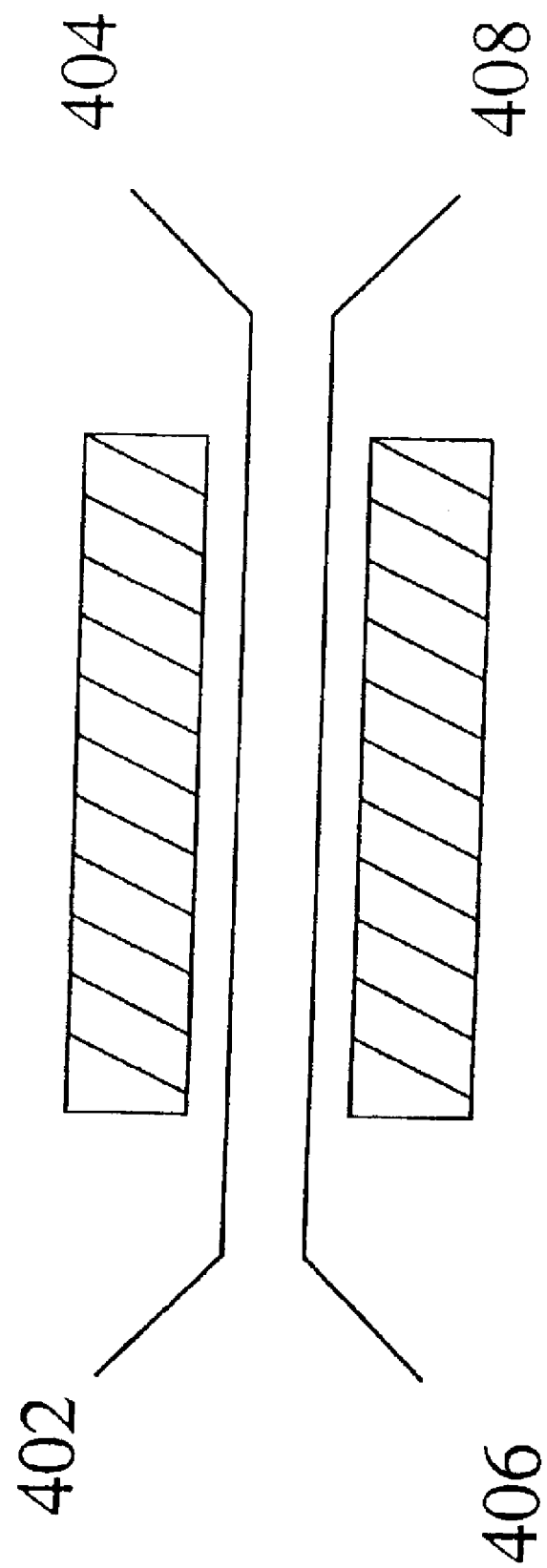
FIG. 8 shows a larger version of the 2×2 directional couplers used.

FIG. 8 shows a larger view of the first, second, third, fourth, and combining 2×2 directional coupler shown in FIGS. 2–6. As shown in FIG. 8, the 2×2 directional coupler contains ports 402, 404, 406, and 408. Each of the ports acts as either an input or an output for light. For example, suppose light exits port 402. After the light has exited, light could then enter port 402. In this way the 2×2 directional coupler has in effect 4 inputs and 4 outputs, as aforementioned. The ports 402, 404, 406, and 408 give the first, second, third, fourth, and combing directional coupler, the ability to send/receive the optical comb, send/receive the first laser output, send/receive the second laser output, and send the primary or secondary combined laser output.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. An apparatus for generating a laser output for heterodyning with improved phase stability, the apparatus comprising:

a first slave laser providing a first laser output, a second slave laser providing a second laser output; and an integrated optical circuit comprising:

an input port receiving an input optical signal;

a plurality of optical couplers interconnected by a plurality of optical waveguides, the plurality of optical couplers and optical waveguides providing a portion of the input optical signal to the first and second slave lasers;

a primary output port providing the laser output, wherein the laser output comprises the first and second laser output; and two ports coupling the first and second slave laser to the integrated optical circuit, wherein the integrated optical circuit is formed on a single substrate.

2. The apparatus of claim 1, wherein the integrated optical circuit comprises a substrate selected from the group consisting of GaAs, LiNbO$_3$, and Si.

3. The apparatus of claim 1, wherein the plurality of optical couplers comprise a member selected from the group consisting of X-junction couplers, multimode interference couplers, and directional couplers.

4. The apparatus of claim 3, wherein the plurality of optical couplers comprise a plurality of directional couplers, and wherein the plurality of directional couplers comprise a plurality of 2×2 directional couplers, the plurality of 2×2 directional couplers having at least one input and at least one output.

5. The apparatus of claim 4, wherein the plurality of 2×2 directional couplers comprises a combining directional coupler, the combining directional coupler combining the first and second laser outputs to create the laser output, the combining directional coupler dividing the laser output between the primary output port and a secondary output port.

6. The apparatus of claim 5, wherein the primary output port of the integrated optical circuit provides the laser output for heterodyning.

7. The apparatus of claim 6, wherein the input optical signal is an optical comb provided from a master laser; the optical comb having multiple optical lines, each of the lines being at a different optical frequency or wavelength.

8. The apparatus of claim 7, wherein the integrated optical circuit further comprises a splitter connected to the input port of the integrated optical circuit; the splitter dividing the optical comb between the first and second slave laser.

9. The apparatus of claim 7, wherein the first slave laser and second slave laser are tuned so that the first and second laser outputs coincide with different optical lines of the optical comb by injection locking, and in response thereto the first and second laser outputs having different frequencies.

10. The apparatus of claim 7, wherein the plurality of 2×2 directional couplers further comprise:

a first directional coupler, the first directional coupler comprising:
an input for receiving a portion of the optical comb;
an output for sending a portion of the optical comb to the first slave laser;
an input for receiving the first laser output;
an output for sending the first laser output to the combining directional coupler;
a first output port providing a portion of the optical comb; and a second directional coupler, the second directional coupler comprising:
an input for receiving a portion of the optical comb;
an output for sending a portion of the optical comb to the second slave laser;
an input for receiving the second laser output;
an output for sending the second laser output to the combining directional coupler; and
a first output port providing a portion of the optical comb.

11. The apparatus of claim 8, wherein the splitter is a 1:2 splitter, the 1:2 splitter having an input and two outputs and splitting the optical comb received at its input among its two outputs.

12. The apparatus of claim 8, wherein the plurality of optical waveguides comprise a first and second waveguide path, the first waveguide path coupling the optical comb from the splitter to the first slave laser and coupling the first laser output to the combining directional coupler, and the second waveguide path coupling the optical comb from the splitter to the second slave laser and coupling the second laser output to the combining directional coupler.

13. The apparatus of claim 10, wherein the plurality of 2×2 directional couplers further comprise:

a third directional coupler comprising:
an input for receiving a portion of the optical comb;
an output for sending a portion of the optical comb to the first directional coupler;
a first output port capable of providing a portion of the optical comb;
a second output port capable of providing a portion of the first slave laser output; and
a fourth directional coupler comprising:
an input for receiving a portion of the optical comb;
an output for sending a portion of the optical comb to the second directional coupler;
an output sending the optical comb to the second directional coupler; and
a first output port capable of providing a portion of the optical comb;
a second output port capable of providing a portion of the second slave laser output.

14. The apparatus of claim 12, wherein the first and second waveguide paths have substantially equal lengths.

15. The apparatus of claim 12, wherein the first and second waveguide paths are separated in the transverse direction by at most 10 millimeters.

16. The apparatus of claim 12, wherein the first and second waveguide paths are no greater than 20 centimeters long, and have lengths within 1 centimeter of each other.

17. The apparatus of claim 12, wherein the first and second waveguide paths are symmetrically located within the integrated optical circuit.

18. The apparatus of claim 13, wherein photodetectors are coupled to the first output port of the second directional coupler, and the first and second output ports of the third and fourth directional couplers.

19. The apparatus of claim 13, wherein a Fabry-Perot etalon is coupled to the first output parts on the first and second directional couplers, the Fabry-Perot etalon monitoring at least one member of the group consisting of the optical comb, the first laser output, and the second laser output.

20. The apparatus of claim 13, further comprising:

a first optical splitter receiving a portion of the laser output from the combining directional coupler, the first optical splitter dividing the laser output between a secondary output port and a first optical splitter output port;

a photodetector coupled to the first optical splitter output port; and a heterodyne phase lock loop coupled to the first slave laser, the photodetector coupled to the first optical splitter output port, and an oscillator coupled to the master laser, the heterodyne phase lock loop controlling the first slave laser.

21. The apparatus of claim 13, further comprising:

a first optical splitter receiving a portion of the second laser output from the fourth directional coupler, the first optical splitter dividing the second laser output between the second output port of the fourth directional coupler, and a first optical splitter output;

a photodetector coupled to the first optical splitter output; and a homodyne phase lock loop coupled to second slave laser, the photodetector coupled to the first optical splitter output, and the first output port providing a portion of the optical comb at the first directional coupler, the homodyne phase lock loop controlling the second slave laser.

22. The apparatus of claim 18, wherein a first feedback circuit is coupled to the photodetectors at the first and second output ports of the third directional coupler, and the first output port of the second directional coupler, and wherein the first feedback circuit is electrically coupled to the first and third directional couplers, the first feedback monitoring the power of the portion of the optical comb injected into the first slave laser and monitoring the power of the first laser output, and in response thereto, adjusting at least one of the first and third directional couplers to obtain the desired power of the optical comb injected into the first slave laser.

23. The apparatus of claim 18, wherein a second feedback circuit is coupled to the photodetectors at the first and second output ports of the fourth directional coupler and the first output port of the second directional coupler and fourth directional couplers, and wherein the second feedback circuit is electrically coupled to the second and fourth directional couplers, the second feedback monitoring the power of the portion of the optical comb injected into the second slave laser and monitoring the power of the second laser output, and in response thereto, adjusting at least one of the second and fourth directional couplers to obtain the desired power of the optical comb injected into the second slave laser.

24. The apparatus of claim 18, further comprising a substrate platform wherein the integrated optical circuit is mounted on the substrate platform.

25. The apparatus of claim 24, wherein the substrate platform contains at least one V-shaped groove for mounting and aligning one or more optical fibers, the optical fibers being coupled to the integrated optical circuit.

26. The apparatus of claim 24, wherein the substrate platform is fabricated from a substrate selected from the group consisting of silicon, glass, indium phosphide, gallium arsenide, and copper.

27. The apparatus of claim 1, wherein the first and second slave lasers are DFB lasers.

28. An apparatus for generating a laser output with improved phase stability for generating one or more microwave signals by heterodyning, the apparatus comprising:

a first slave laser providing a first laser output and a second slave laser providing a second laser output; and an integrated optical circuit formed on a single substrate, the integrated optical circuit comprising:
  an input port receiving an input optical signal;
  a plurality of optical couplers providing a portion of the input optical signal to the first and second slave laser;
  a primary output port providing the laser output, wherein the laser output comprises the first and second laser output; and
  two ports coupling the first and second slave laser to the integrated optical circuit, wherein the plurality of optical couplers, input port, primary output port, and two ports are interconnected by a plurality of optical waveguides, the plurality of optical waveguides comprising a first and second waveguide path, and wherein the first and second waveguide path have substantially equal lengths, and couple the input optical signal from the input port to the first and second slave laser.

29. The apparatus of claim 28, wherein the integrated optical circuit comprises a substrate selected from the group consisting of GaAs, $LiNbO_3$, and Si.

30. The apparatus of claim 28, wherein the plurality of optical couplers comprise a member selected from the group consisting of X-junction couplers, multimode interference couplers, and directional couplers.

31. The apparatus of claim 30, wherein the plurality of optical couplers comprise a plurality of directional couplers, and wherein the plurality of directional couplers comprise a plurality of 2×2 directional couplers, the plurality of 2×2 directional couplers having at least one input and at least one output.

32. The apparatus of claim 31, wherein the plurality of 2×2 directional couplers comprise a combining directional coupler, the combining directional coupler combining the first and second laser outputs to create the laser output, the combining directional coupler dividing the laser output between the primary output port and a secondary output port.

33. The apparatus of claim 32, wherein the primary output port of the integrated optical circuit provides the laser output for heterodyning.

34. The apparatus of claim 33, wherein the input optical signal is an optical comb provided from a master laser; the optical comb having multiple optical lines, each of the lines being at a different optical frequency or wavelength.

35. The apparatus of claim 34, wherein the integrated optical circuit further comprises a splitter connected to the input port of the integrated optical circuit; the splitter dividing the optical comb between the first and second slave laser.

36. The apparatus of claim 35, wherein the first slave laser and second slave laser are tuned so that the first and second laser outputs coincide with different optical lines of the optical comb by injection locking, and in response thereto, the first and second laser outputs having different frequencies.

37. The apparatus of claim 34, wherein the plurality of 2×2 directional couplers further comprise:

a first directional coupler, the first directional coupler comprising:
  an input for receiving a portion of the optical comb;
  an output for sending a portion of the optical comb to the first slave laser;
  an input for receiving the first laser output;
  an output for sending the first laser output to the combining directional coupler;
  a first output port providing a portion of the optical comb; and a second directional coupler, the second directional coupler comprising:
  an input for receiving a portion of the optical comb;
  an output for sending a portion of the optical comb to the second slave laser;
  an input for receiving the second laser output;
  an output for sending the second laser output to the combining directional coupler; and
  a first output port providing a portion of the optical comb.

38. The apparatus of claim 35, wherein the splitter is a 1:2 splitter, the 1:2 splitter having an input and two outputs and splitting the optical comb received at its input among its two outputs.

39. The apparatus of claim 35, wherein the first waveguide path couples the optical comb from the splitter to the first slave laser and couples the first laser output to the combining directional coupler, and the second waveguide path couples the optical comb from the splitter to the second slave laser and couples the second laser output to the combining directional coupler.

40. The apparatus of claim 37, wherein the plurality of 2×2 directional couplers further comprise:
   a third directional coupler comprising:
      an input for receiving a portion of the optical comb;
      an output for sending a portion of the optical comb to the first directional coupler;
      a first output port capable of providing a portion of the optical comb;
      a second output port capable of providing a portion of the first slave laser output; and
   a fourth directional coupler comprising:
      an input for receiving a portion of the optical comb;
      an output for sending a portion of the optical comb to the second directional coupler;
      an output sending the optical comb to the second directional coupler; and
      a first output port capable of providing a portion of the optical comb;
      a second output port capable of providing a portion of the second slave laser output.

41. The apparatus of claim 39, wherein the first and second waveguide paths are separated in the transverse direction by at most 10 millimeters.

42. The apparatus of claim 39, wherein the first and second waveguide paths are no greater than 20 centimeters long, and have lengths within 1 centimeter of each other.

43. The apparatus of claim 39, wherein the first and second waveguide paths are symmetrically located within the integrated optical circuit.

44. The apparatus of claim 40, wherein photodetectors are coupled to the first outport port of the second directional coupler, and the first and second output ports of the third and fourth directional couplers.

45. The apparatus of claim 40, wherein a Fabry-Perot etalon is coupled to the first output ports on the first and second directional couplers, the Fabry-Perot etalon monitoring at least one member of the group consisting of the optical comb, the first laser output, and the second laser output.

46. The apparatus of claim 40, further comprising:
   a first optical splitter receiving a portion of the laser output from the combining directional coupler, the first optical splitter dividing the laser output between a secondary output port and a first optical splitter output port;
   a photodetector coupled to the first optical splitter output port; and
   a heterodyne phase lock loop coupled to the first slave laser, the photodetector coupled to the first optical splitter output port, and an oscillator coupled to the master laser, the heterodyne phase lock loop controlling the first slave laser.

47. The apparatus of claim 40, further comprising:
   a first optical splitter receiving a portion of the second laser output from the fourth directional coupler, the first optical splitter dividing the second laser output between the second output port of the fourth directional coupler, and a first optical splitter output;
   a photodetector coupled to the first optical splitter output; and
   a homodyne phase lock loop coupled to second slave laser, the photodetector coupled to the first optical splitter output, and the first output port providing a portion of the optical comb at the first directional coupler, the homodyne phase lock loop controlling the second slave laser.

48. The apparatus of claim 44, wherein a first feedback circuit is coupled to the photodetectors at the first and second output ports of the third directional coupler, and the first output port of the second directional coupler, and wherein the first feedback circuit is electrically coupled to the first and third directional couplers, the first feedback monitoring the power of the portion of the optical comb injected into the first slave laser and monitoring the power of the first laser output, and in response thereto, adjusting at least one of the first and third directional couplers to obtain the desired power of the optical comb injected into the first slave laser.

49. The apparatus of claim 44, wherein a second feedback circuit is coupled to the photodetectors at the first and second output ports of the fourth directional coupler and the first output port of the second directional coupler and fourth directional couplers, and wherein the second feedback circuit is electrically coupled to the second and fourth directional couplers, the second feedback monitoring the power of the portion of the optical comb injected into the second slave laser and monitoring the power of the second laser output, and in response thereto, adjusting at least one of the second and fourth directional couplers to obtain the desired power of the optical comb injected into the second slave laser.

50. The apparatus of claim 44, further comprising a substrate platform wherein the integrated optical circuit is mounted on the substrate platform.

51. The apparatus of claim 50, wherein the substrate platform contains at least one V-shaped groove for mounting and aligning one or more optical fibers, the optical fibers being coupled to the integrated optical circuit.

52. The apparatus of claim 50, wherein the substrate platform is fabricated from a substrate selected from the group consisting of silicon, glass, indium phosphide, gallium arsenide, and copper.

53. The apparatus of claim 28, wherein the first and second slave lasers are DFB lasers.

54. A method of producing an optical signal to be heterodyned comprising the steps of:
   generating an optical comb with multiple lines, each line of the multiple lines having a different frequency;
   providing a plurality of directional couplers interconnected by a plurality of waveguides on an integrated optical circuit;
   sending the optical comb to a first slave laser and second slave laser via the plurality of directional couplers, and in response thereto generating a first and second laser output; and
   generating a laser output based on the first and second laser output.

55. The method of claim 54, wherein the step of generating a laser output comprises the steps of:
   injection-locking the first and second slave laser to different lines of the optical comb; and
   aligning the frequency of the first and second slave laser to a frequency of the optical comb.

* * * * *